United States Patent
Lee et al.

(10) Patent No.: US 11,533,041 B2
(45) Date of Patent: Dec. 20, 2022

(54) BULK ACOUSTIC WAVE RESONATOR

(71) Applicant: Samsung Electro-Mechanics Co., Ltd., Suwon-si (KR)

(72) Inventors: Tae Kyung Lee, Suwon-si (KR); Ran Hee Shin, Suwon-si (KR); Jin Suk Son, Suwon-si (KR); Je Hong Kyoung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 298 days.

(21) Appl. No.: 16/881,146

(22) Filed: May 22, 2020

(65) Prior Publication Data
US 2021/0135651 A1    May 6, 2021

(30) Foreign Application Priority Data
Nov. 6, 2019    (KR) .......................... 10-2019-0141129

(51) Int. Cl.
| | | |
|---|---|---|
| *H03H 9/17* | (2006.01) | |
| *H03H 9/13* | (2006.01) | |
| *H03H 9/05* | (2006.01) | |
| *H03H 9/54* | (2006.01) | |

(52) U.S. Cl.
CPC ............ *H03H 9/17* (2013.01); *H03H 9/0504* (2013.01); *H03H 9/13* (2013.01); *H03H 9/54* (2013.01)

(58) Field of Classification Search
CPC ........................................................ H03H 9/17
USPC ........................................................ 310/363
See application file for complete search history.

(56) References Cited

U.S. PATENT DOCUMENTS

| | | | |
|---|---|---|---|
| 9,450,561 B2 | 9/2016 | Choy et al. | |
| 2015/0084719 A1 | 3/2015 | Umeda | |
| 2015/0244347 A1 | 8/2015 | Feng et al. | |
| 2018/0278228 A1* | 9/2018 | Hurwitz | ................ H01L 41/107 |
| 2019/0326873 A1* | 10/2019 | Bradley | ............. H03H 9/02015 |
| 2019/0372555 A1* | 12/2019 | Shealy | ............... H03H 9/02015 |

FOREIGN PATENT DOCUMENTS

| | | |
|---|---|---|
| JP | 2015-162905 A | 9/2015 |
| JP | 5994850 B2 | 9/2016 |

* cited by examiner

*Primary Examiner* — Joseph Chang
(74) *Attorney, Agent, or Firm* — NSIP Law (57) ABSTRACT

A bulk acoustic wave resonator includes: a first electrode; a piezoelectric layer disposed on at least a portion of the first electrode; and a second electrode disposed on the piezoelectric layer. The piezoelectric layer contains a dopant, and a value of [a thickness (nm) of the piezoelectric layerxa concentration (at %) of the dopant]/100 is less than or equal to 80.

21 Claims, 10 Drawing Sheets

III-III'

| THICKNESS OF AlScN THIN FILM (nm) | CONCENTRATION OF DOPANT: 6.25 at% | CONCENTRATION OF DOPANT: 12.5 at% | CONCENTRATION OF DOPANT: 20 at% |
|---|---|---|---|
| 200 | 0 | 0 | 0 |
| 300 | 0 | 0 | 0 |
| 400 | 0 | 0 | 0 |
| 500 | 0 | 0 | 3 |
| 600 | 0 | 0 | 5 |
| 700 | 0 | 2 | 8 |
| 800 | 0 | 6 | 13 |
| 900 | 0 | 9 | 18 |
| 1000 | 0 | 9 | 20 |
| 1100 | 0 | 8 | 26 |
| 1200 | 0 | 16 | 35 |
| 1300 | 2 | 21 | 46 |

| [Thickness (nm) of AlScN thin film × Concentration (at%) of Dopant]/10 | CONCENTRATION OF DOPANT: 6.25 at% | CONCENTRATION OF DOPANT: 12.5 at% | CONCENTRATION OF DOPANT: 20 at% |
|---|---|---|---|
| 200 | 12.5 | 25.0 | 40.0 |
| 300 | 18.8 | 37.5 | 60.0 |
| 400 | 25.0 | 50.0 | 80.0 |
| 500 | 31.3 | 62.5 | 100.0 |
| 600 | 37.5 | 75.0 | 120.0 |
| 700 | 43.8 | 87.5 | 140.0 |
| 800 | 50.0 | 100.0 | 160.0 |
| 900 | 56.3 | 112.5 | 180.0 |
| 1000 | 62.5 | 125.0 | 200.0 |
| 1100 | 68.8 | 137.5 | 220.0 |
| 1200 | 75.0 | 150.0 | 240.0 |
| 1300 | 81.3 | 162.5 | 260.0 |

BULK ACOUSTIC WAVE RESONATOR

CROSS-REFERENCE TO RELATED APPLICATION(S)

This application claims the benefit under 35 USC 119(a) of Korean Patent Application No. 10-2019-0141129 filed on Nov. 6, 2019 in the Korean Intellectual Property Office, the entire disclosure of which is incorporated herein by reference for all purposes.

BACKGROUND

1. Field

The following description relates to a bulk acoustic wave resonator.

2. Description of Background

In accordance with the emergence of 5th generation (5G) communication, development of a bulk acoustic wave (BAW) filter for 5G has been conducted. The BAW filter for 5G has a bandwidth significantly wider than that of an existing filter and a communication distance shorter than that of the existing filter, and strength of a signal, power is thus increased.

In order to increase the bandwidth of the BAW filter in accordance with such a trend, there is a need to increase performance of a resonator by increasing a piezoelectric constant of a piezoelectric body. In addition, in order to withstand high power, loss of a piezoelectric thin film needs be reduced to improve reliability of the BAW filter.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

A bulk acoustic wave resonator in which abnormal growth of a piezoelectric layer may be suppressed.

In one general aspect, a bulk acoustic wave resonator includes: a first electrode; a piezoelectric layer disposed on at least a portion of the first electrode; and a second electrode disposed on the piezoelectric layer, wherein the piezoelectric layer contains a dopant, and a value of [a thickness (nm) of the piezoelectric layer×a concentration (at %) of the dopant]/100 is less than or equal to 80.

The piezoelectric layer may include aluminum nitride (AlN).

The dopant may be one of, or a combination of one or more of, scandium (Sc), erbium (Er), yttrium (Y), lanthanum (La), titanium (Ti), zirconium (Zr), hafnium (Hf), tantalum (Ta), and niobium (Nb).

The dopant may be scandium (Sc), and a content of scandium (Sc) in the piezoelectric layer may be 0.1 to 30 at %.

The content of scandium (Sc) in the piezoelectric layer may be 10 to 30 at %.

The bulk acoustic wave resonator may include a substrate disposed on an opposite side of the first electrode from the piezoelectric layer and the second electrode; and a membrane layer disposed between the substrate and the first electrode and defining a cavity together with the substrate.

The bulk acoustic wave resonator may include an etching prevention portion disposed between the substrate and the first electrode and disposed around a periphery of the cavity.

The bulk acoustic wave resonator may include a sacrificial layer disposed to surround the etching prevention portion.

The membrane layer may include a seed layer composed of aluminum nitride (AlN).

The bulk acoustic wave resonator may include an insertion layer at least partially disposed below a portion of the piezoelectric layer.

One or both of the first electrode and the second electrode may be formed of one of molybdenum (Mo), ruthenium (Ru), tungsten (W), iridium (Ir), platinum (Pt), copper (Cu), titanium (Ti) tantalum (Ta), nickel (Ni), and chromium (Cr), or alloys thereof.

A root mean square (RMS) of surface roughness of the first electrode may be 5 nm or less.

One or both of the first electrode and the second electrode may include an aluminum alloy layer containing scandium (Sc).

The bulk acoustic wave resonator may include a substrate disposed on an opposite side of the first electrode from the piezoelectric layer and the second electrode, and the substrate may include a reflective layer that overlaps with an active region in which the first electrode, the piezoelectric layer, and the second electrode overlap each other.

The bulk acoustic wave resonator may include a substrate disposed on an opposite side of the first electrode from the piezoelectric layer and the second electrode, and the substrate may include a cavity forming groove that overlaps an active region in which the first electrode, the piezoelectric layer, and the second electrode overlap each other.

The bulk acoustic wave resonator may include an insulating layer disposed on the cavity forming groove.

In another general aspect, a bulk acoustic wave resonator includes an input electrode, an output electrode, and a doped piezoelectric layer disposed between the input electrode and the output electrode. A product of a thickness of the piezoelectric layer in nanometers and a concentration percentage of a dopant of the piezoelectric layer is less than or equal to 8000.

The dopant may be a rare earth metal or a transition metal.

The dopant may be scandium.

The concentration percentage of the dopant may be between 6.25% and 20% inclusive.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in detail with reference to the accompanying drawings.

Figure 1:
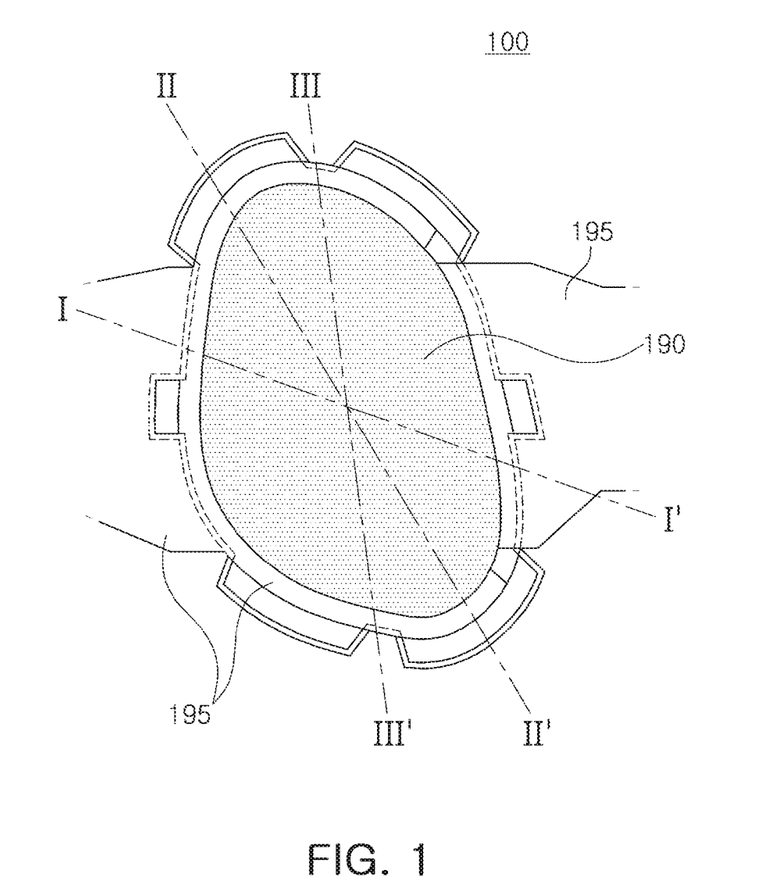
FIG. 1 is a schematic plan view illustrating a bulk acoustic wave resonator according to an example.
Figure 2:
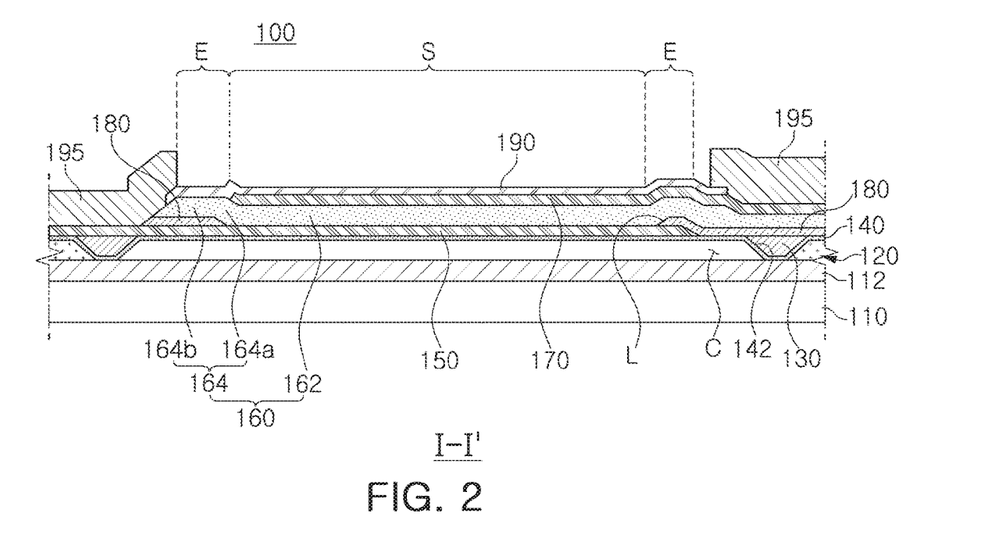
FIG. 2 is a cross-sectional view taken along line I-I' of FIG. 1.
Figure 3:
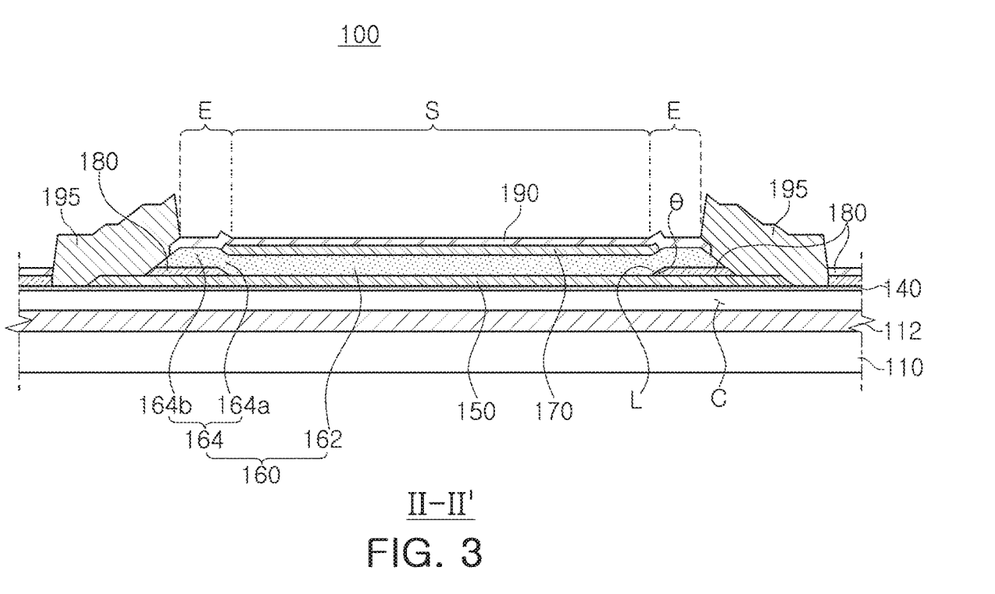
FIG. 3 is a cross-sectional view taken along line II-II' of FIG. 1.
Figure 4:
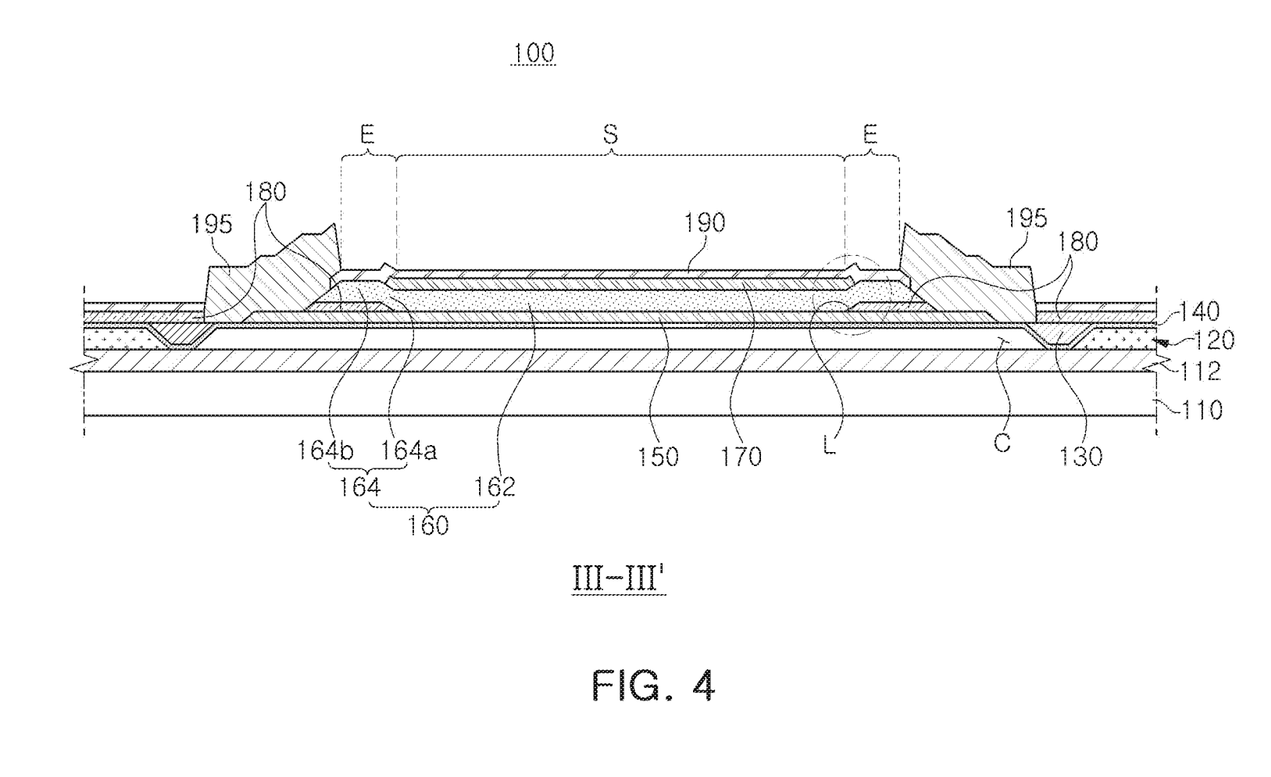
FIG. 4 is a cross-sectional view taken along line III-III' of FIG. 1.

FIG. 1 is a schematic plan view illustrating a bulk acoustic wave resonator according to an example, FIG. 2 is a cross-sectional view taken along line I-I' of FIG. 1, FIG. 3 is a cross-sectional view taken along line II-II' of FIG. 1, and FIG. 4 is a cross-sectional view taken along line III-III' of FIG. 1.

Referring to FIGS. 1 through 4, a bulk acoustic wave resonator 100 may include a substrate 110, a sacrificial layer 120, an etching prevention portion 130, a membrane layer 140, a first electrode 150, a piezoelectric layer 160, a second electrode 170, an insertion layer 180, a passivation layer 190, and a metal pad 195.

The substrate 110 may be a silicon substrate. For example, a silicon wafer or a silicon on insulator (SOI)-type substrate may be used as the substrate 110.

An insulating layer 112 may be formed on an upper surface of the substrate 110, and may electrically insulate a component disposed thereon and the substrate 110 from each other. The insulating layer 112 may serve to prevent the substrate 110 from being etched by an etching gas in a case in which a cavity C is formed in a manufacturing process.

In this case, the insulating layer 112 may be formed of at least one of silicon dioxide ($SiO_2$), silicon nitride ($Si_3N_4$), aluminum oxide ($Al_2O_3$), and aluminum nitride (AlN), and may be formed by any one of a chemical vapor deposition process, a radio frequency (RF) magnetron sputtering process, and an evaporation process.

The sacrificial layer 120 may be formed on the insulating layer 112, and the cavity C and the etching prevention portion 130 may be disposed in the sacrificial layer 120. The cavity C may be formed by removing a part of the sacrificial layer 120 at the time of being manufactured. As described above, the cavity C may be formed inside the sacrificial layer 120, and the first electrode 150 and the like disposed on the sacrificial layer 120 may thus be formed flat.

The etching prevention portion 130 may be disposed along a boundary of the cavity C. The etching prevention portion 130 may prevent etching from being performed beyond a cavity region in a process of forming the cavity C.

The membrane layer 140 may form the cavity C together with the substrate 110. The membrane layer 140 may be formed of a material having low reactivity to an etching gas at the time of removing the sacrificial layer 120. The etching prevention portion 130 may be inserted and disposed into a groove 142 formed by the membrane layer 140. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the membrane layer 140.

A seed layer (not illustrated) formed of aluminum nitride (AlN) may be formed on the membrane layer 140. That is, the seed layer may be disposed between the membrane layer 140 and the first electrode 150. The seed layer may be formed of a dielectric material or a metal having a hexagonal close packed (HCP) grain structure, in addition to aluminum nitride (AlN). As an example, in a case in which the seed layer is formed of the metal, the seed layer may be formed of titanium (Ti).

The first electrode 150 may be formed on the membrane layer 140, and may be partially disposed above the cavity C. The first electrode 150 may be used as any one of an input electrode or an output electrode inputting and outputting an electrical signal such as a radio frequency (RF) signal or the like.

The first electrode 150 may be formed of, for example, an aluminum alloy containing scandium (Sc). Since the first electrode 150 is formed of the aluminum alloy containing scandium (Sc), mechanical strength of the first electrode 150 may be increased, such that high power reactive sputtering may be performed. Under such a deposition condition, an increase in surface roughness of the first electrode 150 may be prevented, and highly oriented growth of the piezoelectric layer 160 may also be induced.

A chemical resistance of the first electrode 150 may be increased by containing scandium (Sc) as a material of the first electrode 150 to make up for a disadvantage occurring in a case in which the first electrode is formed of pure aluminum. Further, stability of a process such as a dry etch process, a wet process, or the like at the time of manufacturing the bulk acoustic wave resonator may be secured. Furthermore, oxidation easily occurs in a case in which the first electrode is formed of pure aluminum, but the first electrode 150 may be formed of the aluminum alloy containing scandium, such that chemical resistance to the oxidation may be improved.

However, the first electrode 150 is not limited to such a composition, and may be formed of, for example, a conductive material such as molybdenum (Mo) or an alloy thereof. However, the first electrode 150 is not limited to such a composition, and may be formed of a conductive material such as ruthenium (Ru), tungsten (W), iridium (Ir), platinum (Pt), copper (Cu), titanium (Ti) tantalum (Ta), nickel (Ni), chromium (Cr), or the like, or alloys thereof.

The piezoelectric layer 160 may be formed to cover at least the first electrode 150 disposed above the cavity C. The piezoelectric layer 160 may generate a piezoelectric effect of converting electric energy into mechanical energy having an acoustic wave form, and may include, for example, aluminum nitride (AlN).

The piezoelectric layer 160 may be doped with a dopant such as a rare earth metal or a transition metal. As an example, the rare earth metal used as the dopant may include at least one of scandium (Sc), erbium (Er), yttrium (Y), and lanthanum (La). Further, the transition metal used as the dopant may include at least one of titanium (Ti), zirconium (Zr), hafnium (Hf), tantalum (Ta), and niobium (Nb). The piezoelectric layer 160 may also include magnesium (Mg), which is a divalent metal.

The piezoelectric layer 160 may be formed so that a value of the following Equation is 80 or less.

[Thickness (nm) of Piezoelectric Layer×Concentration (at %) of Dopant]/100          Equation In more detail, first, the aluminum nitride (AlN) may be used as a base material of the piezoelectric layer 160. In order to continuously increase a bandwidth of the piezoelectric layer 160, a content of the dopant contained in the piezoelectric layer 160, such as scandium (Sc) needs to be continuously increased. However, it may become difficult to implement a highly oriented aluminum nitride layer due to an increase in the content of the dopant such as scandium.

Figure 5:
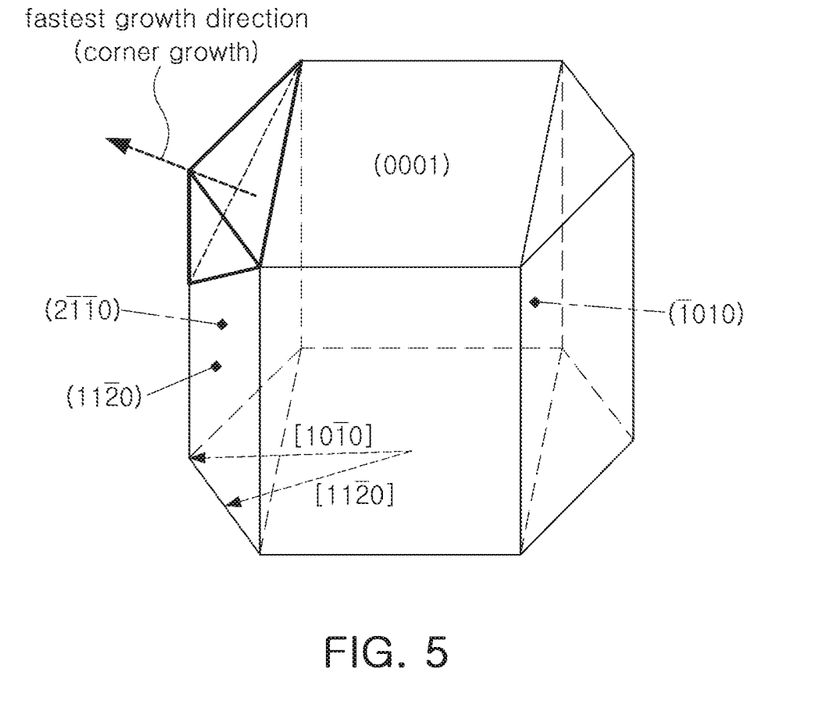
FIG. 5 is a view for describing a wurtzite grain structure of aluminum nitride.
Figure 6:
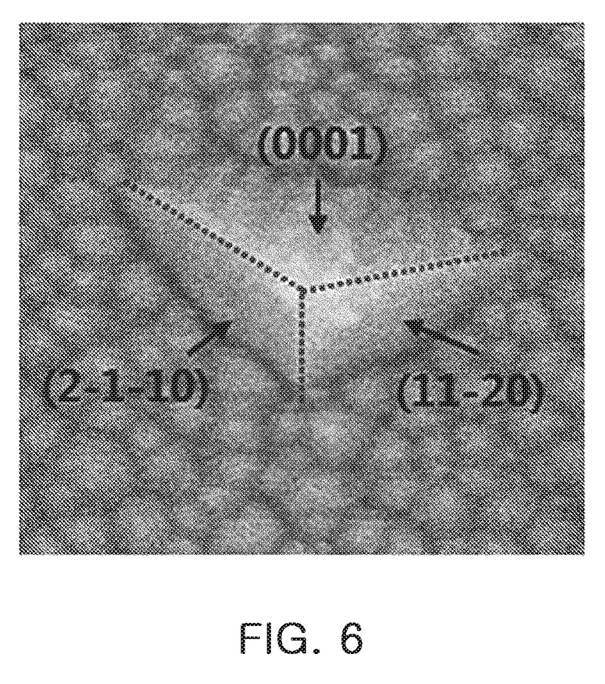
FIG. 6 is a photograph for describing abnormal growth of a grain larger than a normal grain.

In more detail, as illustrated in FIG. 5, the aluminum nitride may have a wurtzite grain structure of an HCP structure. However, in a case in which the aluminum nitride is doped with the dopant such as scandium, a dopant element such as a scandium element may be substituted in place of an aluminum element. However, when the content of the dopant such as scandium is increased, rapid grain growth may occur in an edge grain direction in an HCP grain structure, resulting in abnormal growth of a grain larger than a normal grain as illustrated in FIG. 6.

Particularly, when the content of the dopant such as scandium is further increased, a probability that such abnormal growth will occur may be increased, resulting in an exponential increase in an occurrence frequency of the abnormal growth.

The dopant used to improve piezoelectric properties of the piezoelectric layer 160 may correspond to an element having an atomic diameter larger than that of aluminum (Al). That is, since the element having the atomic diameter larger than that of aluminum (Al) are substituted for aluminum (Al), deformation may occur in a grain structure, and as the content of the dopant is increased, the probability that the abnormal growth will occur may also be increased due to an increase in such deformation.

Abnormal growth may generally be described by a grain boundary relaxation model. Abnormal growth of a thin film may occur in a gap existing at a grain boundary, which is a boundary between grains, and such a gap may be a site of abnormal growth nucleation. In a case in which the abnormal growth occurs in an open grain boundary, surface free energy during growth of the thin film may be reduced, which is an environment that may generally appear.

The surface roughness of the first electrode 150 before the piezoelectric layer 160 is deposited may also have an important influence on the abnormal growth. In a case in which a root mean square (RMS) of the surface roughness of the first electrode 150 in an active region where the first electrode 150 and the second electrode 170 overlap each other is 5 nm or more, a possibility that the abnormal growth will occur may be increased. As described above, in a case in which the abnormal growth occurs in a state where the surface roughness is increased, there may be a risk that the bulk acoustic wave resonator 100 will be damaged due to the abnormal growth in a high output and high voltage environment. The surface roughness may be analyzed by performing an atomic force microscope (AFM) analysis or by surface roughness of the first electrode 150 of a transmission electron microscope (TEM) cross section. Therefore, the RMS of the surface roughness of the first electrode 150 may be less than 5 nm.

As the content of the dopant such as scandium (Sc) is increased, the occurrence frequency of the abnormal growth may be increased. The reason may be that as the content of the dopant such as scandium (Sc) is increased, open grain boundary sites are increased, such that the probability that the abnormal growth will occur is also increased.

In addition, sputtering deposition may be performed by a reactive reaction with a nitrogen gas using an AlSc alloy target for each content of the dopant such as scandium (Sc). A density of the abnormal growth may be confirmed by a scanning electron microscope (SEM) while gradually increasing a thickness of an AlScN thin film from 200 nm to 1300 nm by 100 nm. In general, a component analysis of the dopant such as scandium (Sc) within the AlScN thin film may be performed by a TEM, and a dopant component may be represented by a content ratio (at %) of the dopant such as scandium (Sc) when a total content of aluminum (Al) and the dopant such as scandium (Sc) is 100 at %.

Figure 7:
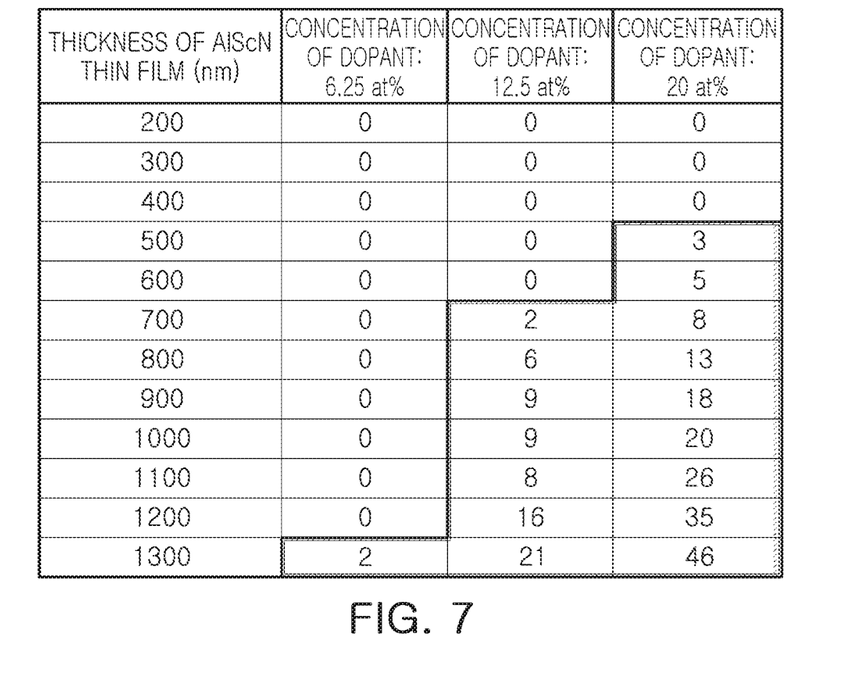
FIG. 7 is a table illustrating abnormal growth densities according to thicknesses of a piezoelectric layer and concentrations of a dopant.
Figure 8:
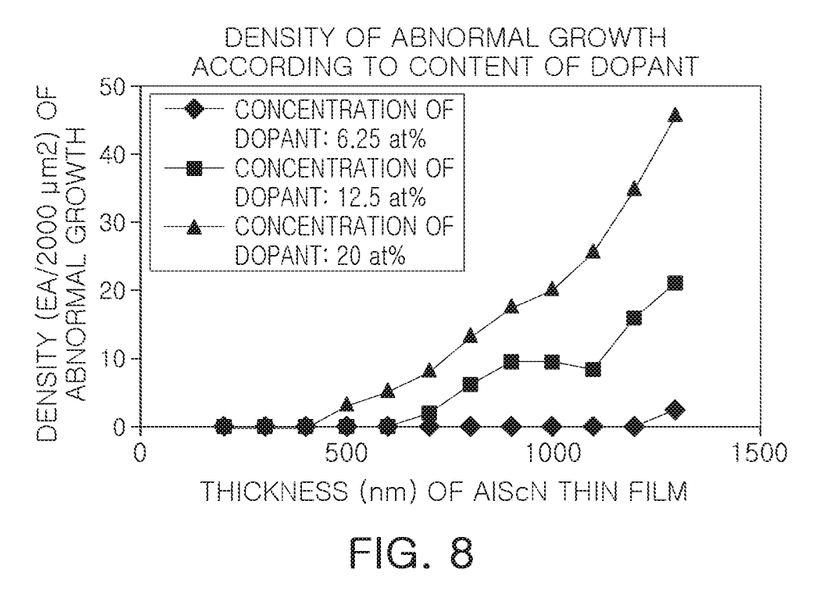
FIG. 8 is a graph illustrating abnormal growth densities according to thicknesses of a piezoelectric layer and concentrations of a dopant.

As illustrated in FIGS. 7 and 8, even though contents of dopant such as scandium (Sc) contained in the piezoelectric layer 160 are the same as each other, in a case in which a thickness of the piezoelectric layer 160 is increased, occurrence of abnormal growth may also be increased, and a size of the abnormal growth may also be increased. This phenomenon may appear since normal grain growth but also growth of the abnormal growth occurs in terms of grain growth according to an increase in the thickness of the piezoelectric layer 160.

Figure 9:
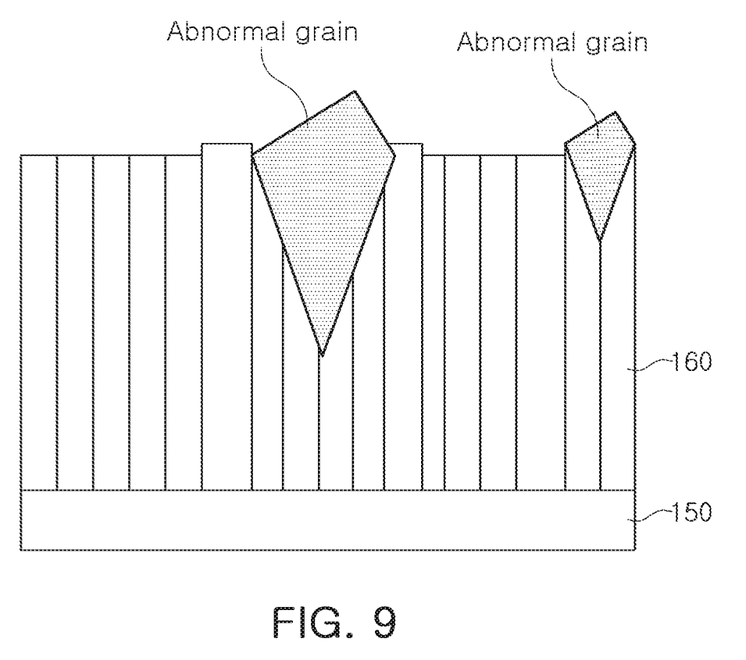
FIG. 9 is a view for describing a region in which abnormal growth occurs.
Figure 10:
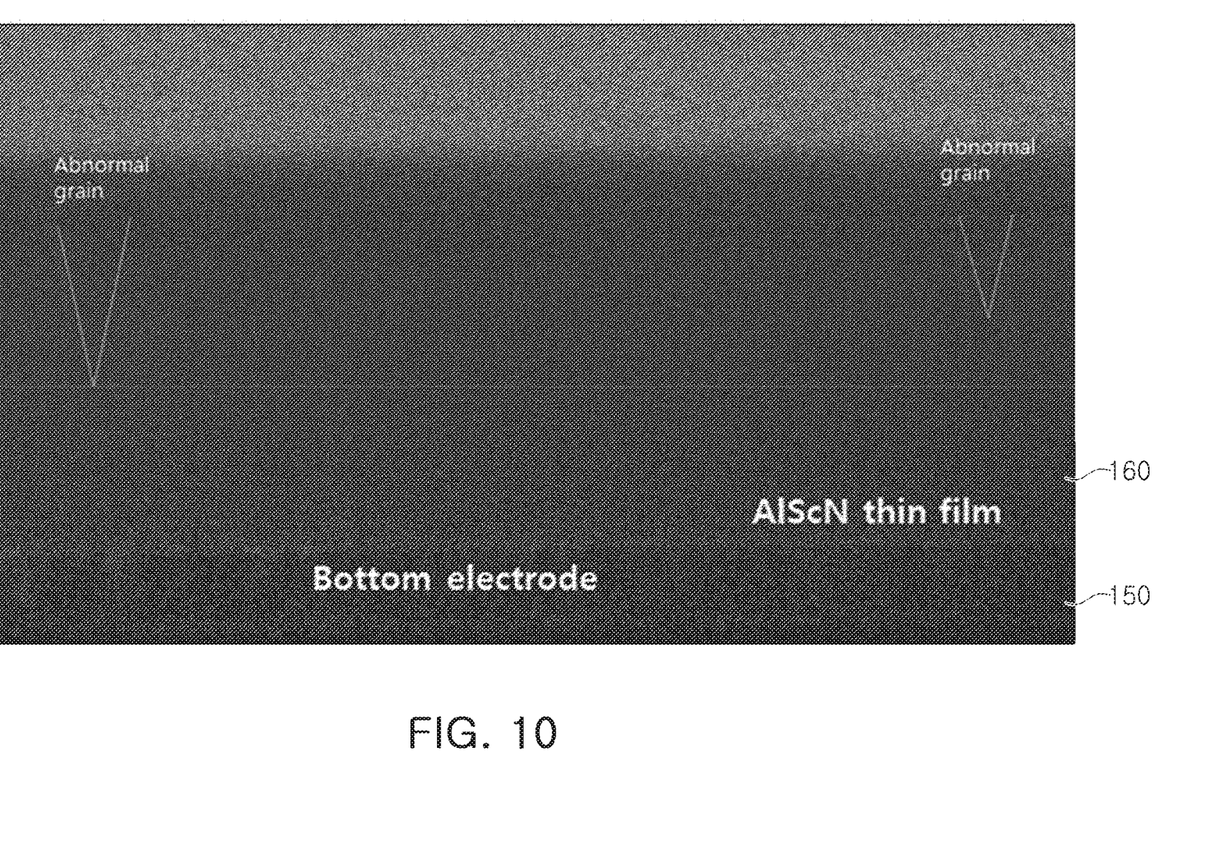
FIG. 10 is a photograph for describing a region in which abnormal growth occurs.

It may be seen from FIG. 9 that the abnormal growth of the piezoelectric layer 160 does not occur in the initial stage, but occurs from a predetermined thickness or more of the piezoelectric layer 160. It may be seen from FIG. 10 that in a case in which a focused ion beam (FIB) cross section analysis is performed on the piezoelectric layer 160 in which the abnormal growth actually occurs, the abnormal growth occurs from a predetermined thickness or more of the piezoelectric layer 160.

It may be seen from FIGS. 7 and 8 that in a case in which the content of the dopant such as scandium (Sc) is 6.25 at %, the abnormal growth starts to be observed from when the thickness of the piezoelectric layer 160 is 1300 nm. In addition, it may be seen from FIGS. 7 and 8 that in a case in which the content of the dopant such as scandium (Sc) is 12.5 at %, the abnormal growth starts to be observed from when the thickness of the piezoelectric layer 160 is 700 nm. Further, it may be seen from FIGS. 7 and 8 that in a case in which the content of the dopant such as scandium (Sc) is 20 at %, the abnormal growth starts to be observed from when the thickness of the piezoelectric layer 160 is 500 nm.

Therefore, when a state where the abnormal growth does not occur is confirmed through the above Equation, it may be seen that a value of [Thickness (nm) of Piezoelectric Layer×Concentration (at %) of Dopant]/100 is 80 or less.

Figure 11:
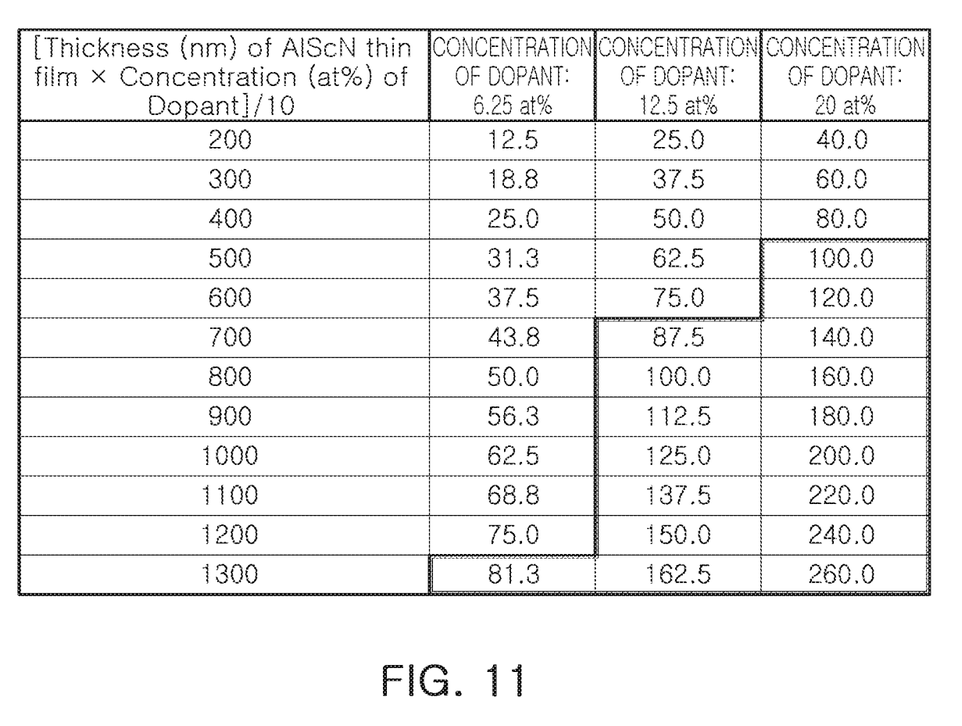
FIG. 11 is a table illustrating values of [Thickness (nm) of Piezoelectric Layer×Concentration (at %) of Dopant]/100.

That is, as illustrated in FIG. 11, the abnormal growth may occur in a portion surrounded by a thick line, that is, in a case in which the value of [Thickness (nm) of Piezoelectric Layer×Concentration (at %) of Dopant]/100 is larger than 80.

As a result, in a case in which a bulk acoustic wave (BAW) filter is manufactured using the piezoelectric layer having the thickness at which the abnormal growth does not occur according to the content of the dopant such as scandium (Sc), the BAW filter may be manufactured without causing a defect of the piezoelectric layer 160. In a case in which there is no defect of the piezoelectric layer 160, the piezoelectric layer 160 of the bulk acoustic wave resonator 100 having high reliability under a high output and high voltage condition may be implemented to contribute to improvement of reliability of the bulk acoustic wave resonator 100.

In a case in which the dopant is scandium (Sc), the content of scandium (Sc) in the piezoelectric layer 160 may be 0.1 to 30 at %. The content of scandium (Sc), which is the dopant, needs to be 0.1 at % or more in order to implement high piezoelectric properties as compared with a case in which the piezoelectric layer is formed of aluminum nitride (AlN). When the content of scandium (Sc) is 30 at % or more, it may not be easy to produce an AlSc alloy target. In a case in which the content of scandium (Sc) is 30 at % or more, when the AlSc alloy target is produced by a melting method, there may be a problem that the AlSc alloy target is brittle, such that it is not easy to produce and process the AlSc alloy target.

Further, in a case in which the dopant is scandium (Sc), the content of scandium (Sc) in the piezoelectric layer 160 may be 10 to 30 at %. That is, in a case in which the content of scandium (Sc) is 10 at % or less, an occurrence frequency of the abnormal growth according to the increase in the thickness of the piezoelectric layer 160 may be small, but in a case in which the content of scandium (Sc) is 10 at % or more, an occurrence frequency of the abnormal growth of the piezoelectric layer 160 may be rapidly increased.

Particularly, in a case in which the content of the dopant such as scandium (Sc) is 10 at % or more, the occurrence frequency of the abnormal growth may be increased, and it may thus be more preferable to manufacture the piezoelectric layer 160 in such a numerical range of the content of the dopant.

The piezoelectric layer 160 may include a piezoelectric portion 162 disposed in a flat portion S and a bent portion 164 disposed in an extension portion E.

The piezoelectric portion 162 may be a portion directly stacked on an upper surface of the first electrode 150. Therefore, the piezoelectric portion 162 may be interposed between the first electrode 150 and the second electrode 170 and be formed to be flat together with the first electrode 150 and the second electrode 170.

The bent portion 164 may refer to a region extending outwardly from the piezoelectric portion 162 and positioned in the extension portion E.

The bent portion 164 may be disposed on the insertion layer, and may have a form in which it protuberates along a shape of the insertion layer 180. Therefore, the piezoelectric layer 160 may be bent at a boundary between the piezoelectric portion 162 and the bent portion 164, and the bent portion 164 may protuberate depending on a thickness and a shape of the insertion layer 180.

The bent portion 164 may be divided into an inclined portion 164a and an extended portion 164b.

The inclined portion 164*a* may refer to a portion inclined along an inclined surface L of the insertion layer 180. The extended portion 164*b* may refer to a portion extended outwardly from the inclined portion 164*a*.

The inclined portion 164*a* may be formed in parallel with the inclined surface L of the insertion layer 180, and an inclined angle of the inclined portion 164*a* may be the same as an inclined angle of the inclined surface L of the insertion layer 180.

The second electrode 170 may be formed to cover at least the piezoelectric layer 160 disposed above the cavity C. The second electrode 170 may be used as any one of an input electrode and an output electrode inputting and outputting an electrical signal such as a radio frequency (RF) signal or the like. That is, in a case in which the first electrode 150 is used as the input electrode, the second electrode 170 may be used as the output electrode, and in a case in which the first electrode 150 is used as the output electrode, the second electrode 170 may be used as the input electrode.

The second electrode 170 may be formed of, for example, a conductive material such as molybdenum (Mo) or an alloy thereof. However, the second electrode 170 is not limited to such a composition, and may be formed of a conductive material such as ruthenium (Ru), tungsten (W), iridium (Ir), platinum (Pt), copper (Cu), titanium (Ti) tantalum (Ta), nickel (Ni), chromium (Cr), or the like, or alloys thereof.

The insertion layer 180 may be formed between the first electrode 150 and the piezoelectric layer 160. The insertion layer 180 may be formed of a dielectric material such as silicon dioxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, but may be formed of a material different from that of the piezoelectric layer 160. A region in which the insertion layer 180 is provided may be formed as the air, if necessary. The air may be implemented by removing the insertion layer 180 in a manufacturing process.

The insertion layer 180 may be formed to have a thickness that is the same as or similar to that of the first electrode 150. The insertion layer 180 may be formed to have a thickness that is similar to or smaller than that of the piezoelectric layer 160. For example, the insertion layer 180 may be formed to have a thickness of 100 Å or more, and may be formed to have a thickness smaller than that of the piezoelectric layer 160. However, a configuration of the insertion layer 180 and the piezoelectric layer 160 is not limited to such a configuration.

The insertion layer 180 may be disposed along a surface formed by the membrane layer 140, the first electrode 150, and the etching prevention portion 130.

The insertion layer 180 may be disposed in the vicinity of the flat portion S and support the bent portion 164 of the piezoelectric layer 160. Therefore, the bent portion 164 of the piezoelectric layer 160 may be divided into the inclined portion 164*a* and the extended portion 164*b* along the shape of the insertion layer 180.

The insertion layer 180 may be disposed in a region except for the flat portion S. For example, the insertion layer 180 may be disposed over the entirety of the region except for the flat portion S or be disposed in a portion of the region except for the flat portion S.

At least a portion of the insertion layer 180 may be disposed between the piezoelectric layer 160 and the first electrode 150.

A side surface of the insertion layer 180 disposed along a boundary of the flat portion S may have a thickness that becomes large as it becomes distant from the flat portion S. Therefore, the side surface of the insertion layer 180 disposed adjacent to the flat portion S may be formed as the inclined surface L having a predetermined inclined angle Θ.

When the inclined angle Θ of the side surface of the insertion layer 180 is smaller than 5°, a thickness of the insertion layer 180 needs to be very small or an area of the inclined surface L needs to be excessively large in order to manufacture the insertion layer 180 of which the inclined angle Θ of the side surface is smaller than 5°, which is substantially difficult to be implemented.

When the inclined angle Θ of the side surface of the insertion layer 180 is larger than 70°, an inclined angle of the inclined portion 164*a* of the piezoelectric layer 160 stacked on the insertion layer 180 may be larger than 70°. In this case, the piezoelectric layer 160 is excessively bent, such that a crack may occur in the bent portion of the piezoelectric layer 160.

Therefore, in the example, the inclined angle Θ of the inclined surface L may be in a range of 5° or more and 70° or less.

The passivation layer 190 may be formed both in a region in which portions of the first and second electrodes 150 and 170 overlap and in a region in which portions of the first and second electrodes 150 and 170 do not overlap. The passivation layer 190 may serve to prevent the second electrode 170 and the first electrode 150 from being damaged during a process.

Further, a portion of the passivation layer 190 may be etched and removed in order to adjust a frequency in a final process. That is, a thickness of the passivation layer 190 may be adjusted. For example, a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the passivation layer 190.

The metal pad 195 may be formed in portions of the first and second electrodes 150 and 170 in which the passivation layer 190 is not formed. As an example, the metal pad 195 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

As described above, the value of [Thickness (nm) of Piezoelectric Layer×Concentration (at %) of Dopant]/100 may be 80 or less, and the abnormal growth of the piezoelectric layer 160 may thus be prevented.

Figure 12:
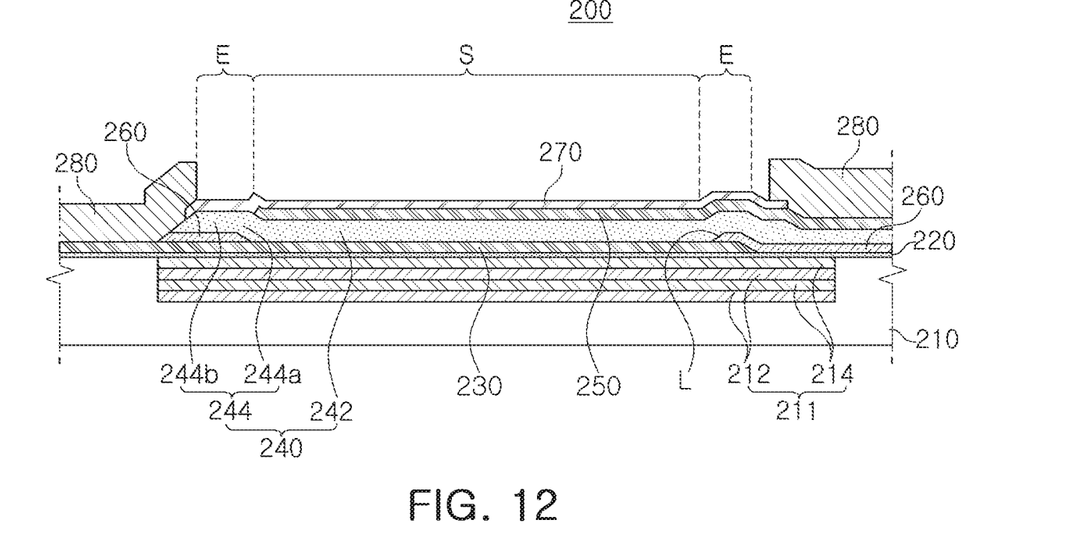
FIG. 12 is a schematic cross-sectional view illustrating a bulk acoustic wave resonator according to an example.

FIG. 12 is a schematic cross-sectional view illustrating a bulk acoustic wave resonator according to an example.

Referring to FIG. 12, a bulk acoustic wave resonator 200 may include a substrate 210, a membrane layer 220, a first electrode 230, a piezoelectric layer 240, a second electrode 250, an insertion layer 260, a passivation layer 270, and a metal pad 280.

The substrate 210 may be a substrate in which silicon is stacked. For example, a silicon wafer may be used as the substrate 210. The substrate 210 may be provided with a reflective layer 211.

The reflective layer 211 may be disposed below an active region. Here, the active region may refer to a region in which the first electrode 230, the piezoelectric layer 240, and the second electrode 250 are disposed to overlap each other.

The reflective layer 211 may include first and second reflective members 212 and 214 disposed in a groove. The first and second reflective members 212 and 214 may be formed of different materials.

The first reflective member 212 may be formed of a conductive material such as molybdenum (Mo) or an alloy thereof. However, the first reflective member 212 is not limited to such a composition, and may be formed of ruthenium (Ru), tungsten (W), iridium (Ir), platinum (Pt), copper (Cu), aluminum (Al), titanium (Ti) tantalum (Ta), nickel (Ni), chromium (Cr), or the like. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the second reflective member 214. A total of four first and second reflective members 212 and 214, that is, two pairs of first and second reflective members 212 and 214 may be provided. However, the first and second reflective members 212 and 214 are not limited to such a configuration, and a pair of first and second reflective members 212 and 214 may be provided or three or more pairs of first and second reflective members 212 and 214 may be provided.

A first reflective member 212 may be formed of a material having a density higher than that of the second reflective member 214.

The membrane layer 220 may be formed to cover the reflective layer 211 of the substrate 210. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the membrane layer 220.

A seed layer (not illustrated) formed of aluminum nitride (AlN) may be formed on the membrane layer 220. That is, the seed layer may be disposed between the membrane layer 220 and the first electrode 230. The seed layer may be formed of a dielectric material or a metal having a hexagonal close packed (HCP) grain structure, in addition to aluminum nitride (AlN). As an example, in a case in which the seed layer is formed of the metal, the seed layer may be formed of titanium (Ti).

The first electrode 230 may be formed on the membrane layer 220. The first electrode 230 may be used as any one of an input electrode and an output electrode inputting and outputting an electrical signal such as a radio frequency (RF) signal or the like.

The first electrode 230 may be formed of, for example, an aluminum alloy containing scandium (Sc). Since the first electrode 230 is formed of the aluminum alloy containing scandium (Sc), mechanical strength of the first electrode 230 may be increased, such that high power reactive sputtering may be performed. Under such a deposition condition, an increase in surface roughness of the first electrode 230 may be prevented, and highly oriented growth of the piezoelectric layer 240 may also be induced.

A chemical resistance of the first electrode 230 may be increased by containing scandium (Sc) as a material of the first electrode 230 to make up for a disadvantage occurring in a case in which the first electrode is formed of pure aluminum. Further, stability of a process such as a dry etch process, a wet process, or the like at the time of manufacturing the bulk acoustic wave resonator may be secured. Furthermore, oxidation easily occurs in a case in which the first electrode is formed of pure aluminum, but the first electrode 230 may be formed of the aluminum alloy containing scandium, such that chemical resistance to the oxidation may be improved.

However, the first electrode 230 is not limited to such a composition, and may be formed of, for example, a conductive material such as molybdenum (Mo) or an alloy thereof. However, the first electrode 230 is not limited to such a composition, and may be formed of a conductive material such as ruthenium (Ru), tungsten (W), iridium (Ir), platinum (Pt), copper (Cu), titanium (Ti) tantalum (Ta), nickel (Ni), chromium (Cr), or the like, or alloys thereof.

An RMS of the surface roughness of the first electrode 230 may be less than 5 nm.

The piezoelectric layer 240 may be formed to cover at least the first electrode 230 disposed above the reflective layer 211. The piezoelectric layer 240 may generate a piezoelectric effect of converting electric energy into mechanical energy having an acoustic wave form, and may include, for example, aluminum nitride (AlN).

The piezoelectric layer 240 may be doped with a dopant such as a rare earth metal or a transition metal. As an example, the rare earth metal used as the dopant may include at least one of scandium (Sc), erbium (Er), yttrium (Y), and lanthanum (La). Further, the transition metal used as the dopant may include at least one of titanium (Ti), zirconium (Zr), hafnium (Hf), tantalum (Ta), and niobium (Nb). The piezoelectric layer 240 may also include magnesium (Mg), which is a divalent metal.

The piezoelectric layer 240 may be formed so that a value of the following Equation is 80 or less.

[Thickness (nm) of Piezoelectric Layer×Concentration (at %) of Dopant]/100    Equation The piezoelectric layer 240 may include a piezoelectric portion 242 disposed in a flat portion S and a bent portion 244 disposed in an extension portion E.

The piezoelectric portion 242 may be a portion directly stacked on an upper surface of the first electrode 230. Therefore, the piezoelectric portion 242 may be interposed between the first electrode 230 and the second electrode 250 and be formed to be flat together with the first electrode 230 and the second electrode 250.

The bent portion 244 may refer to a region extending outwardly from the piezoelectric portion 242 and positioned in the extension portion E.

The bent portion 244 may be disposed on the insertion layer 260, and may have a form in which it protuberates along a shape of the insertion layer 260. Therefore, the piezoelectric layer 240 may be bent at a boundary between the piezoelectric portion 242 and the bent portion 244, and the bent portion 244 may protuberate depending on a thickness and a shape of the insertion layer 260.

The bent portion 244 may be divided into an inclined portion 244a and an extended portion 244b.

The inclined portion 244a may refer to a portion inclined along an inclined surface L of the insertion layer 260. The extended portion 244b may refer to a portion extended outwardly from the inclined portion 244a.

The inclined portion 244a may be formed in parallel with the inclined surface L of the insertion layer 260, and an inclined angle of the inclined portion 244a may be the same as an inclined angle of the inclined surface L of the insertion layer 260.

The second electrode 250 may be formed to cover at least the piezoelectric layer 240 disposed above the reflective layer 211. The second electrode 250 may be used as any one of an input electrode and an output electrode inputting and outputting an electrical signal such as a radio frequency (RF) signal or the like. That is, in a case in which the first electrode 230 is used as the input electrode, the second electrode 250 may be used as the output electrode, and in a case in which the first electrode 230 is used as the output electrode, the second electrode 250 may be used as the input electrode.

The second electrode 250 may be formed of, for example, a conductive material such as molybdenum (Mo) or an alloy thereof. However, the second electrode 250 is not limited to such a configuration, and may be formed of a conductive material such as ruthenium (Ru), tungsten (W), iridium (Ir), platinum (Pt), copper (Cu), titanium (Ti) tantalum (Ta), nickel (Ni), chromium (Cr), or the like, or alloys thereof.

The insertion layer 260 may be formed between the first electrode 230 and the piezoelectric layer 240. The insertion layer 260 may be formed of a dielectric material such as silicon dioxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, but may be formed of a material different from that of the piezoelectric layer 240. A region in which the insertion layer 260 is provided may be formed as the air, if necessary. The air may be implemented by removing the insertion layer 260 in a manufacturing process.

The insertion layer 260 may be formed to have a thickness that is the same as or similar to that of the first electrode 230. The insertion layer 260 may be formed to have a thickness that is similar to or smaller than that of the piezoelectric layer 240. For example, the insertion layer 260 may be formed to have a thickness of 100 Å or more, and may be formed to have a thickness smaller than that of the piezoelectric layer 240. However, a configuration of the insertion layer 260 and the piezoelectric layer 240 is not limited to such a configuration.

The insertion layer 260 may be disposed along a surface formed by the membrane layer 220 and the first electrode 230.

The insertion layer 260 may be disposed in the vicinity of the flat portion S and support the bent portion 244 of the piezoelectric layer 240. Therefore, the bent portion 244 of the piezoelectric layer 240 may be divided into the inclined portion 244a and the extended portion 244b along the shape of the insertion layer 260.

The insertion layer 260 may be disposed in a region except for the flat portion S. For example, the insertion layer 260 may be disposed over the entirety of the region except for the flat portion S or be disposed in a portion of the region except for the flat portion S.

At least a portion of the insertion layer 260 may be disposed between the piezoelectric layer 240 and the first electrode 230.

The passivation layer 270 may be formed both in a region in which portions of the first and second electrodes 230 and 250 overlap and in a region in which portions of the first and second electrodes 230 and 250 do not overlap. The passivation layer 270 may serve to prevent the second electrode 250 and the first electrode 230 from being damaged during a process.

Further, a portion of the passivation layer 270 may be etched and removed in order to adjust a frequency in a final process. That is, a thickness of the passivation layer 270 may be adjusted. For example, a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the passivation layer 270.

The metal pad 280 may be formed in portions of the first and second electrodes 230 and 250 in which the passivation layer 270 is not formed. As an example, the metal pad 280 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

As described above, the value of [Thickness (nm) of Piezoelectric Layer×Concentration (at %) of Dopant]/100 may be 80 or less, and the abnormal growth of the piezoelectric layer 240 may thus be prevented.

Figure 13:
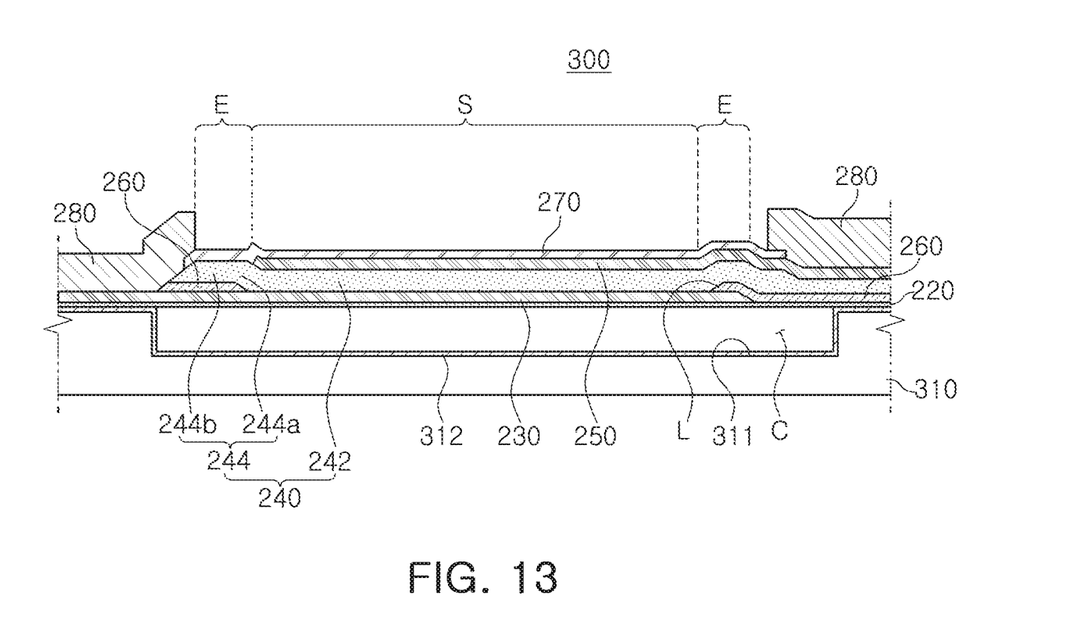
FIG. 13 is a schematic cross-sectional view illustrating a bulk acoustic wave resonator according to an example.

FIG. 13 is a schematic cross-sectional view illustrating a bulk acoustic wave resonator according to an example.

Referring to FIG. 13, a bulk acoustic wave resonator 300 may include a substrate 310, a membrane layer 220, a first electrode 230, a piezoelectric layer 240, a second electrode 250, an insertion layer 260, a passivation layer 270, and a metal pad 280.

Since the membrane layer 220, the first electrode 230, the piezoelectric layer 240, the second electrode 250, the insertion layer 260, the passivation layer 270 and the metal pad 280 are substantially the same as those included in the bulk acoustic wave resonator 200 illustrated in FIG. 12, a detailed description therefor is omitted.

The substrate 310 may be a substrate in which silicon is stacked. For example, a silicon wafer may be used as the substrate 310.

The substrate 310 may be provided with a cavity forming groove 311 for forming a cavity C. An insulating layer 312 may be formed on the substrate 310, and may electrically insulate a component disposed thereon and the substrate 310 from each other. The insulating layer 312 may serve to prevent the substrate 310 from being etched by an etching gas in a case in which the cavity C is formed in a manufacturing process.

In this case, the insulating layer 312 may be formed of at least one of silicon dioxide ($SiO_2$), silicon nitride ($Si_3N_4$), aluminum oxide ($Al_2O_3$), and aluminum nitride (AlN), and may be formed by any one of a chemical vapor deposition process, a radio frequency (RF) magnetron sputtering process, and an evaporation process.

As set forth above, according to various examples, abnormal growth of the piezoelectric layer may be suppressed.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
a first electrode;
a piezoelectric layer disposed on at least a portion of the first electrode; and
a second electrode disposed on the piezoelectric layer,
a substrate disposed on an opposite side of the first electrode from the piezoelectric layer and the second electrode, and
an etching prevention portion disposed between the substrate and the first electrode,
wherein the piezoelectric layer contains a dopant, and
a value of [a thickness (nm) of the piezoelectric layer×a concentration (at %) of the dopant]/100 is less than or equal to 80.

2. The bulk acoustic wave resonator of claim 1, wherein the piezoelectric layer includes aluminum nitride (AlN).

3. The bulk acoustic wave resonator of claim 2, wherein the dopant is one of, or a combination of one or more of, scandium (Sc), erbium (Er), yttrium (Y), lanthanum (La), titanium (Ti), zirconium (Zr), hafnium (Hf), tantalum (Ta), and niobium (Nb).

4. The bulk acoustic wave resonator of claim 3, wherein the dopant is scandium (Sc), and a content of scandium (Sc) in the piezoelectric layer is 0.1 to 30 at %.

5. The bulk acoustic wave resonator of claim 4, wherein the content of scandium (Sc) in the piezoelectric layer is 10 to 30 at %.

6. The bulk acoustic wave resonator of claim 1, further comprising a membrane layer disposed between the substrate and the first electrode and defining a cavity together with the substrate.

7. The bulk acoustic wave resonator of claim 6, wherein the etching prevention is disposed around a periphery of the cavity.

8. The bulk acoustic wave resonator of claim 1, further comprising a sacrificial layer disposed to surround the etching prevention portion.

9. The bulk acoustic wave resonator of claim 6, wherein the membrane layer includes a seed layer composed of aluminum nitride (AlN).

10. The bulk acoustic wave resonator of claim 1, further comprising an insertion layer at least partially disposed below a portion of the piezoelectric layer.

11. The bulk acoustic wave resonator of claim 1, wherein one or both of the first electrode and the second electrode is formed of one of molybdenum (Mo), ruthenium (Ru), tungsten (W), iridium (Ir), platinum (Pt), copper (Cu), titanium (Ti) tantalum (Ta), nickel (Ni), and chromium (Cr), or alloys thereof.

12. The bulk acoustic wave resonator of claim 1, wherein a root mean square (RMS) of surface roughness of the first electrode is 5 nm or less.

13. The bulk acoustic wave resonator of claim 1, wherein one or both of the first electrode and the second electrode includes an aluminum alloy layer containing scandium (Sc).

14. The bulk acoustic wave resonator of claim 1, further comprising a substrate disposed on an opposite side of the first electrode from the piezoelectric layer and the second electrode, wherein the substrate comprises a reflective layer that overlaps with an active region in which the first electrode, the piezoelectric layer, and the second electrode overlap each other.

15. The bulk acoustic wave resonator of claim 1, further comprising a substrate disposed on an opposite side of the first electrode from the piezoelectric layer and the second electrode, wherein the substrate comprises a cavity forming groove that overlaps an active region in which the first electrode, the piezoelectric layer, and the second electrode overlap each other.

16. The bulk acoustic wave resonator of claim 15, further comprising an insulating layer disposed on the cavity forming groove.

17. A bulk acoustic wave resonator comprising:
an input electrode;
an output electrode;
a doped piezoelectric layer disposed between the input electrode and the output electrode;
a substrate disposed on an opposite side of the input electrode from the doped piezoelectric layer and the output electrode; and
a membrane layer disposed between the substrate and the input electrode and defining a cavity together with the substrate,
wherein a product of a thickness of the piezoelectric layer in nanometers and a concentration percentage of a dopant of the piezoelectric layer is less than or equal to 8000, and
wherein the membrane layer includes a seed layer composed of aluminum nitride (AlN).

18. The bulk acoustic wave resonator of claim 17, wherein the dopant is a rare earth metal or a transition metal.

19. The bulk acoustic wave resonator of claim 18, wherein the dopant is scandium.

20. The bulk acoustic wave resonator of claim 17, wherein the concentration percentage of the dopant is between 6.25% and 20% inclusive.

21. A bulk acoustic wave resonator comprising:
a first electrode;
a piezoelectric layer disposed on at least a portion of the first electrode;
a second electrode disposed on the piezoelectric layer; and
an insertion layer partially disposed on and in contact with the first electrode, exposing at least a portion of the first electrode to be in contact with the piezoelectric layer,
wherein the piezoelectric layer contains a dopant, and
a value of [a thickness (nm) of the piezoelectric layer×a concentration (at %) of the dopant]/100 is less than or equal to 80.

* * * * *